United States Patent
Yang et al.

(10) Patent No.: US 12,088,275 B2
(45) Date of Patent: Sep. 10, 2024

(54) ELECTRONIC DEVICE COMPRISING SURFACE ACOUSTIC WAVE FILTER

(71) Applicant: SAMSUNG ELECTRONICS CO., LTD., Suwon-si (KR)

(72) Inventors: Dongil Yang, Suwon-si (KR); Jonghun Yoo, Suwon-si (KR); Namjun Cho, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 17/696,355

(22) Filed: Mar. 16, 2022

(65) Prior Publication Data

US 2022/0209739 A1 Jun. 30, 2022

Related U.S. Application Data

(63) Continuation of application No. PCT/KR2020/012630, filed on Sep. 18, 2020.

(30) Foreign Application Priority Data

Sep. 18, 2019 (KR) .......................... 10-2019-0114552

(51) Int. Cl.
*H03H 9/145* (2006.01)
*H03H 9/02* (2006.01)
*H03H 9/64* (2006.01)

(52) U.S. Cl.
CPC ........ *H03H 9/145* (2013.01); *H03H 9/02543* (2013.01); *H03H 9/6406* (2013.01)

(58) Field of Classification Search
CPC .... H03H 9/145; H03H 9/6403; H03H 9/6406; H03H 9/02543; H03H 9/14544; H03H 9/0538; H03H 9/02992; H03H 2009/155
See application file for complete search history.

(56) References Cited

U.S. PATENT DOCUMENTS 6,522,047 B1 * 2/2003 Toda .................... H03H 9/1455
310/313 R
9,048,809 B2 6/2015 Adkisson et al.
(Continued)

FOREIGN PATENT DOCUMENTS

KR  10-2005-0023641  3/2005
KR  10-2007-0021006  2/2007
(Continued)

*Primary Examiner* — Quan Tra
(74) *Attorney, Agent, or Firm* — Nixon & Vanderhye, P.C.

(57) ABSTRACT

An electronic device according to an embodiment includes: an antenna, a filter configured to pass a signal of a specific frequency band among signals transmitted and received through the antenna, and a processor configured to control the filter to pass the signal of the specific frequency band. The filter includes: a first substrate, a second substrate facing the first substrate, a first group of electrodes disposed inside the first substrate, a second group of electrodes disposed inside the second substrate, a first transducer electrode including a first group of lines, a second transducer electrode including a second group of lines disposed to alternate with the first group of lines, and a power supply configured to apply voltages to the first group of electrodes and the second group of electrodes. The processor is configured to cause at least one of the second group of lines to be separated from the first substrate, by controlling the power supply based on a frequency of a signal to be passed through the filter.

15 Claims, 9 Drawing Sheets

(56) References Cited

U.S. PATENT DOCUMENTS

| | | | |
|---|---|---|---|
| 9,124,240 | B2 | 9/2015 | Shimizu et al. |
| 9,252,733 | B2 | 2/2016 | Adkisson et al. |
| 9,935,600 | B2 | 4/2018 | Adkisson et al. |
| 10,367,475 | B2 | 7/2019 | Caron |
| 10,447,235 | B2 | 10/2019 | Yasuda |
| 10,541,673 | B2 | 1/2020 | Caron |
| 10,547,673 | B2 | 1/2020 | Liu et al. |
| 10,879,870 | B2 | 12/2020 | Kishimoto et al. |
| 11,012,054 | B2 | 5/2021 | Caron |
| 2011/0012696 | A1* | 1/2011 | Skarp .............. H03H 9/6403 333/195 |
| 2013/0099875 | A1 | 4/2013 | Shimizu et al. |
| 2013/0169383 | A1* | 7/2013 | Adkisson ......... H03H 9/1092 333/186 |
| 2013/0187729 | A1* | 7/2013 | Adkisson ......... H10N 30/00 333/186 |
| 2016/0072469 | A1 | 3/2016 | Adkisson et al. |
| 2016/0329877 | A1* | 11/2016 | Nishimura ......... H03H 9/0595 |
| 2019/0089321 | A1* | 3/2019 | Morinaga .......... H03H 9/1014 |
| 2019/0190487 | A1 | 6/2019 | Yasuda |
| 2019/0238114 | A1 | 8/2019 | Kishimoto et al. |

FOREIGN PATENT DOCUMENTS

| | | |
|---|---|---|
| KR | 10-2019-0025038 | 3/2019 |
| KR | 10-2019-0039773 | 4/2019 |
| KR | 10-2019-0063479 | 6/2019 |

\* cited by examiner

ELECTRONIC DEVICE COMPRISING SURFACE ACOUSTIC WAVE FILTER

CROSS-REFERENCE TO RELATED APPLICATIONS

This application is a continuation of International Application No. PCT/KR2020/012630 designating the United States, filed on Sep. 18, 2020 in the Korean Intellectual Property Receiving Office and claiming priority to Korean Patent Application No. 10-2019-0114552, filed on Sep. 18, 2019, in the Korean Intellectual Property Office, the disclosures of which are incorporated by reference herein in their entireties.

BACKGROUND

Field

The disclosure relates to a technology for selectively passing RF signals depending on frequencies.

Description of Related Art

With the development of mobile communication technology, an electronic device equipped with an antenna, such as a smartphone, a wearable device, or the like, has been widely used. The electronic device may transmit/receive various types of data (e.g., a message, a photo, a video, a music file, a game, and the like) through the antenna.

The electronic device may include a plurality of filters capable of passing signals of specific frequency bands among signals transmitted/received through the antenna. For example, the frequency bands of signals that the respective filters are able to pass may differ from one another, and signals passing through the filters may be transmitted to a processor. However, in the case where the plurality of filters are disposed in the electronic device to pass signals of several frequency bands, the electronic device may lack a mounting space.

SUMMARY

Embodiments of the disclosure provide an electronic device for addressing the problems mentioned above but is not limited thereto.

An electronic device according to an example embodiment of the disclosure includes: at least one antenna, a filter connected with the at least one antenna and configured to pass a signal of a specific frequency band among signals transmitted and received through the at least one antenna, and a processor connected with the filter and configured to: control the filter to pass the signal of the specific frequency band. The filter includes: a first substrate, a second substrate facing the first substrate, a first group of electrodes disposed inside the first substrate, a second group of electrodes disposed inside the second substrate, a first transducer electrode including a first group of lines extending in a first direction on the first substrate, a second transducer electrode including a second group of lines extending in a second direction opposite to the first direction on the first substrate and disposed to alternate with the first group of lines, and a power supply configured to apply voltages to the first group of electrodes and the second group of electrodes. The processor is configured to: cause at least one of the second group of lines to be separated from the first substrate, controlling the power supply to apply the voltages to the first group of electrodes and the second group of electrodes, based on a frequency of a signal to be passed through the filter.

A filter according to an example embodiment of the disclosure includes: a first substrate, a second substrate facing the first substrate, a first group of electrodes disposed inside the first substrate, a second group of electrodes disposed inside the second substrate, a first transducer electrode including a first group of lines extending in a first direction on the first substrate, a second transducer electrode including a second group of lines extending in a second direction opposite to the first direction on the first substrate and disposed to alternate with the first group of lines, and a power supply configured to apply voltages to the first group of electrodes and the second group of electrodes. The power supply is configured to apply voltages to the first group of electrodes and the second group of electrodes such that at least one of the second group of lines is separated from the first substrate.

An electronic device according to an example embodiment of the disclosure includes: at least one antenna, a filter connected with the at least one antenna and configured to pass a signal of a specific frequency band among signals transmitted and received through the at least one antenna, and a processor connected with the filter and configured to: control the filter to pass the signal of the specific frequency band. The filter includes: a substrate, an electrode plate facing the substrate, a power supply configured to apply a voltage to the electrode plate, first transducer electrodes disposed on the substrate, second transducer electrodes disposed on the substrate to alternate with the first transducer electrodes, a plurality of switches connected with the first transducer electrodes and the second transducer electrodes, and a switch controller configured to control short-circuiting or opening of the switches. The electronic device may further include a processor configured to: cause at least one of the second transducer electrodes to be separated from the substrate, by controlling the switch controller to short-circuit or open the switches based on a frequency of a signal to be passed through the filter.

According to various example embodiments of the disclosure, the mounting space of the electronic device may be increased.

In addition, the disclosure may provide various effects that are directly or indirectly recognized.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
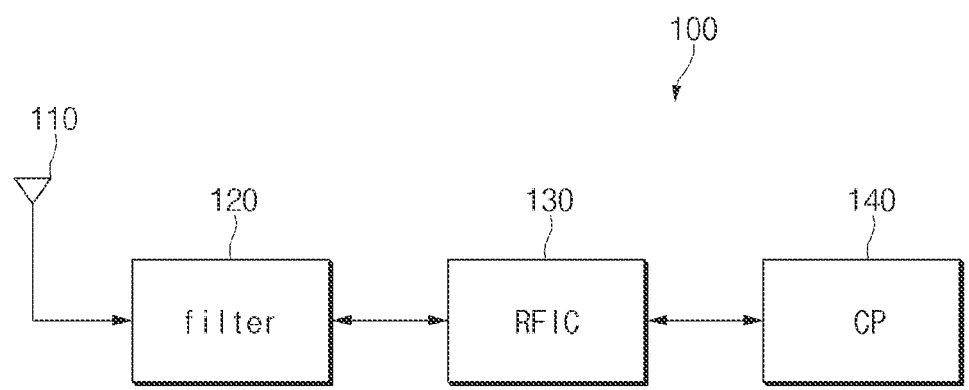
FIG. 1 is a block diagram illustrating an example configuration of an electronic device according to various embodiments.

FIG. 1 is a block diagram illustrating an example configuration of an electronic device according to various embodiments.

Referring to FIG. 1, the electronic device 100 may include at least one antenna element (e.g., including an antenna) 110, a filter 120, a radio frequency integrated circuit (RFIC) 130, and a communication processor (CP) (e.g., including communication processing circuitry) 140.

The at least one antenna element 110 may include at least part of a housing. The housing may form the exterior of the electronic device 100 to protect various types of components from an external impact. The housing may include a glass cover, a back cover, and a side member (e.g., side surface or side bezel) surrounding a space between the glass cover and the back cover. The at least one antenna element 110 may include at least part of an area of the side member that is formed of a metallic material.

The filter 120 may pass a signal of a specific frequency band among signals transmitted and received through the at least one antenna element 110. According to an embodiment, the filter 120 may move at least a part of electrodes included in the filter 120 to change a frequency band that the filter 120 is able to pass.

The RFIC 130 may apply a voltage to the filter 120, or may transmit a command transmitted from the communication processor 140 to the filter 120.

The communication processor 140 may include various communication processing circuitry and perform control such that the filter 120 passes the signal of the specific frequency band. For example, the communication processor 140 may transmit, to the filter 120, a command to move at least a part of the electrodes included in the filter 120. In the disclosure, the communication processor 140 may be referred to as the CP.

An electronic device according to a comparative example may include a plurality of filters for passing only signals of specific bands among signals transmitted/received through at least one antenna element. The electronic device may lack a mounting space as the number of filters is increased. However, the electronic device 100 according to the embodiment of the disclosure may pass signals of several frequency bands with the one filter 120 by moving a part of the electrodes included in the filter 120. Accordingly, the space occupied by the filter 120 in the electronic device 100 may be decreased, and a mounting space of the electronic device 100 may be increased.

Figure 2:
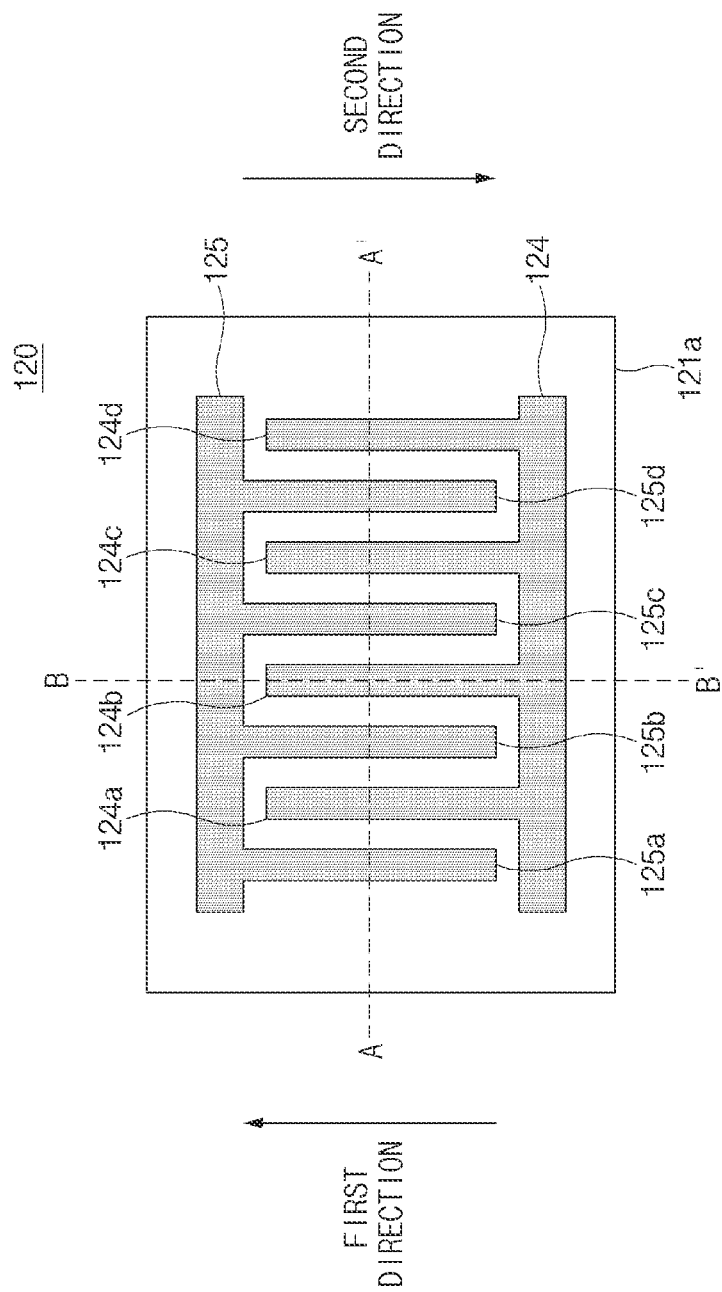
FIG. 2 is a diagram illustrating one surface of a substrate according to various embodiments.

FIG. 2 is a diagram illustrating one surface of a substrate according to various embodiments.

Referring to FIG. 2, the filter 120 may include a first substrate 121a, a first transducer electrode 124, and a second transducer electrode 125.

The first substrate 121a may be a substrate made, for example, of a piezoelectric material. As the first substrate 121a is made of the piezoelectric material, a force to move the first transducer electrode 124 and/or the second transducer electrode 125 on the first substrate 121a may be generated when a voltage is applied to the first substrate 121a.

The first transducer electrode 124 may include a first group of lines 124a, 124b, 124c, and 124d extending in a first direction on the first substrate 121a. The second transducer electrode 125 may include a second group of lines 125a, 125b, 125c, and 125d extending in a second direction opposite to the first direction on the first substrate 121a. The second group of lines 125a, 125b, 125c, and 125d may be disposed to alternate with the first group of lines 124a, 124b, 124c, and 124d.

According to an embodiment, the first transducer electrode 124 and the second transducer electrode 125 may convert electrical signals to generate surface acoustic waves (SAW). The resonant frequencies of the first transducer electrode 124 and the second transducer electrode 125 may vary depending on the gap between the first transducer electrode 124 and the second transducer electrode 125 and the thicknesses of the first transducer electrode 124 and the second transducer electrode 125. In the disclosure, the first transducer electrode 124 and the second transducer electrode 125 may be referred to as inter-digital transducers (IDTs).

In the case of the electronic device according to the comparative example, a first transducer electrode and a second transducer electrode may be fixed on a first substrate. Accordingly, the transducer electrodes having different gaps and thicknesses for respective frequency bands have to be included in the electronic device, and therefore the electronic device may lack a mounting space. However, the electronic device 100 according to an embodiment of the disclosure may move at least part of the second transducer electrode 125 by applying a voltage to the first substrate 121a. When the at least part of the second transducer electrode 125 moves, the gap between the first transducer electrode 124 and the second transducer electrode 125 may vary, and therefore a frequency band that the filter 120 is able to pass may also vary. For example, according to an embodiment of the disclosure, the filter 120 may pass signals of several frequency bands, and thus the mounting space of the electronic device 100 may be increased.

Figure 3:
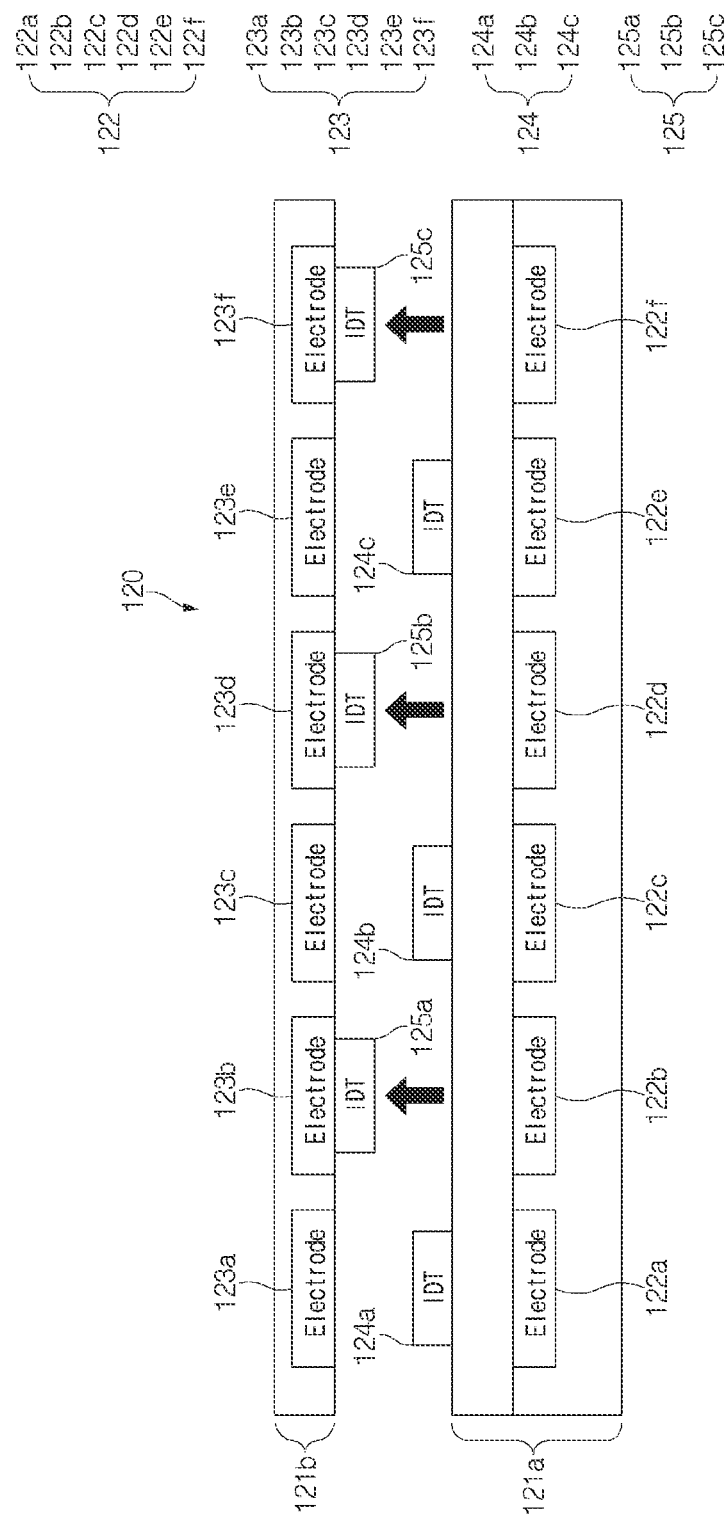
FIG. 3 is a diagram illustrating a section of a filter according to various embodiments.

FIG. 3 is a diagram illustrating a section of the filter according to various embodiments. FIG. 3 is a sectional view of the filter 120 taken along line A-A' illustrated in FIG. 2.

Figure 4:
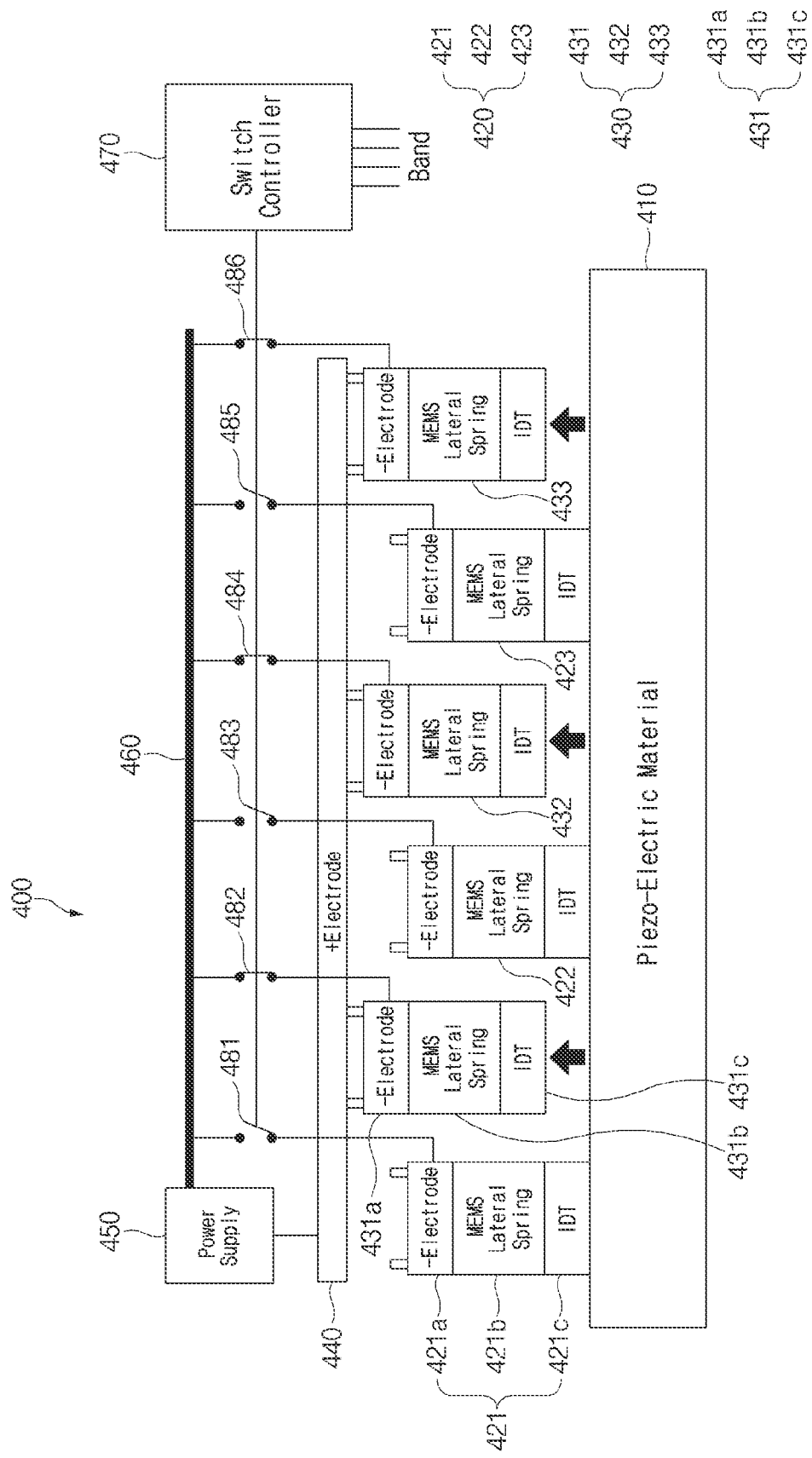
FIG. 4 is a sectional view of a filter according to, taken along line A-A' of FIG. 2 according to various embodiments.

Referring to FIG. 3, the filter 120 may include the first substrate 121a, a second substrate 121b facing the first substrate 121a, a first group of electrodes 122, a second group of electrodes 123, the first transducer electrode 124, the second transducer electrode 125, and a power supply (e.g., 450 of FIG. 4).

The first group of electrodes 122 may be disposed inside the first substrate 121a. The first group of electrodes 122 may include a plurality of electrodes 122a, 122b, 122c, 122d, 122e, and 122f. The first group of electrodes 122 may be disposed in positions corresponding to the first transducer electrode 124 and the second transducer electrode 125.

The second group of electrodes 123 may be disposed inside the second substrate 121b. The second group of electrodes 123 may include a plurality of electrodes 123a, 123b, 123c, 123d, 123e, and 123f. The second group of electrodes 123 may be disposed in positions corresponding to the first transducer electrode 124 and the second transducer electrode 125.

The power supply may apply voltages to the first group of electrodes 122 and the second group of electrodes 123. In an embodiment, when the difference between the voltages applied to the first group of electrodes 122 and the second group of electrodes 123 by the power supply is greater than or equal to a specified value, the second transducer electrode 125 may move to the second substrate 121*b*. For example, when the voltage difference between the electrode 122*b* and the electrode 123*b* is greater than or equal to the specified value, the first line 125*a* among the lines 125*a*, 125*b*, and 125*c* included in the second transducer electrode 125 may move to the second substrate 121*b*. The description of the first line 125*a* among the lines 125*a*, 125*b*, and 125*c* included in the second transducer electrode 125 may be applied to the second line 125*b* and the third line 125*c*.

In an embodiment, when the difference between the voltages applied to the first group of electrodes 122 and the second group of electrodes 123 by the power supply is less than the specified value, the second transducer electrode 125 may be located on the first substrate 121*a* without moving to the second substrate 121*b*. For example, when the voltage difference between the electrode 122*b* and the electrode 123*b* is less than the specified value, the first line 125*a* among the lines 125*a*, 125*b*, and 125*c* included in the second transducer electrode 125 may be located on the first substrate 121*a*.

In the case of the electronic device according to the comparative example, the first transducer electrode and the second transducer electrode may be fixed on the first substrate. Accordingly, the transducer electrodes having different gaps and thicknesses for respective frequency bands have to be included in the electronic device, and therefore the electronic device may lack a mounting space. However, the electronic device 100 according to the embodiment of the disclosure may move at least part of the second transducer electrode 125 by applying the voltages to the first group of electrodes 122 and the second group of electrodes 123. When the at least part of the second transducer electrode 125 moves, the gap between the first transducer electrode 124 and the second transducer electrode 125 may vary, and therefore a frequency band that the filter 120 is able to pass may also vary. For example, according to an embodiment of the disclosure, the one filter 120 may pass signals of several frequency bands, and thus the mounting space of the electronic device 100 may be increased.

In the disclosure, the disclosure with reference to FIGS. 2 and 3 may be identically or similarly applied to components having the same reference numerals as the components illustrated in FIGS. 2 and 3.

Figure 5:
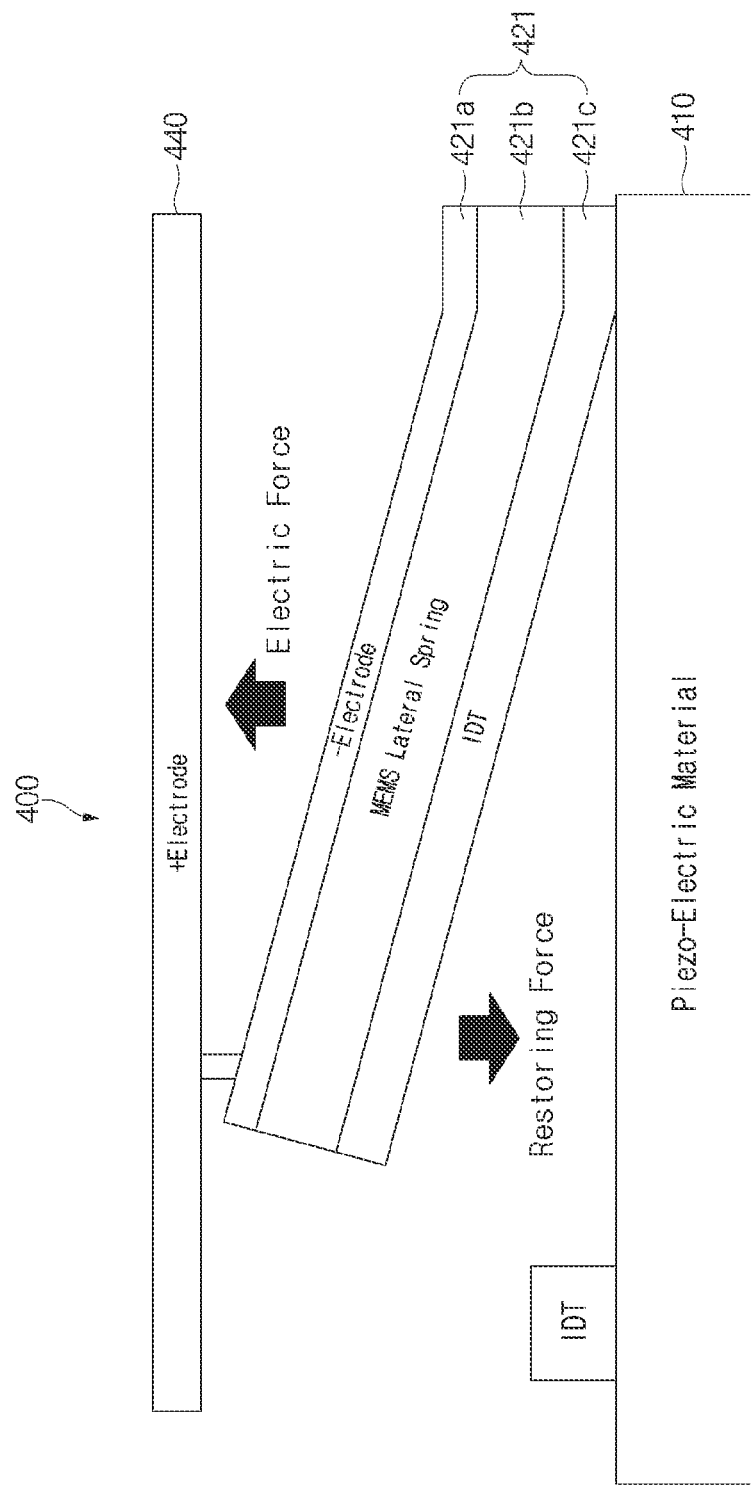
FIG. 5 is a sectional view of the filter, taken along line B-B' of FIG. 2 according to various embodiments.

FIG. 4 is a sectional view of a filter, taken along line A-A' of FIG. 2 according to various embodiments. FIG. 5 is a sectional view of the filter according to, taken along line B-B' of FIG. 2 according to various embodiments. FIG. 4 is a sectional view of the filter 400 according to an embodiment, taken along line A-A' illustrated in FIG. 2. FIG. 5 is a sectional view of the filter 400 according to an embodiment, taken along line B-B' illustrated in FIG. 2.

Referring to FIGS. 4 and 5, the filter 400 according to an embodiment may include a substrate 410, a first transducer electrode 420, a second transducer electrode 430, an electrode plate 440, a power supply 450, a ground layer 460, switches 481, 482, 483, 484, 485, and 486, and a switch controller 470.

The first substrate 410 may be a substrate 410 made of a piezoelectric material. As the first substrate 410 is made of the piezoelectric material, a force to move the first transducer electrode 420 and/or the second transducer electrode 430 on the first substrate 410 may be generated when a voltage is applied to the first substrate 410.

The first transducer electrode 420 may include a plurality of lines 421, 422, and 423, and each of the lines 421, 422, and 423 may include layers 421*a*, 421*b*, and 421*b*. For example, each of the lines 421, 422, and 423 may include the electrode layer 421*a*, the spring 421*b*, and the inter-digital transducer (IDT) 421*c*.

The second transducer electrode 430 may include a plurality of lines 431, 432, and 433, and each of the lines 431, 432, and 433 may include layers 431*a*, 431*b*, and 431*c*. For example, each of the lines 431, 432, and 433 may include the electrode layer 431*a*, the spring 431*b*, and the inter-digital transducer (IDT) 431*c*. Among the layers 431*a*, 431*b*, and 431*c*, the electrode layer 431*a* may be located in the uppermost position so as to make contact with the electrode plate 440, and the IDT 431*c* may be located in the lowermost position so as to make contact with the substrate 410. The spring 431*b* may be located between the electrode layer 431*a* and the IDT 431*c*.

The power supply 450 may be connected with the ground layer 460 and the electrode plate 440. The power supply 450 may apply a predetermined voltage or more to the electrode plate 440.

The switches 481, 482, 483, 484, 485, and 486 may be connected with the ground layer 460 and the electrode layers included in the respective lines 421, 422, 423, 431, 432, and 433. When the switches 481, 482, 483, 484, 485, and 486 are short-circuited, the lines 421, 422, 423, 431, 432, and 433 may be separated from the substrate 410 by an electromagnetic force. In contrast, when the switches 481, 482, 483, 484, 485, and 486 are opened, the lines 421, 422, 423, 431, 432, and 433 may make contact with the substrate 410 by a restoring force. For example, when the second switch 482 is short-circuited, the first line 431 included in the second transducer electrode 430 may be separated from the substrate 410. In contrast, when the second switch 482 is opened, the first line 431 included in the second transducer electrode 430 may make contact with the substrate 410.

The switch controller 470 may adjust short-circuiting or opening of the switches 481, 482, 483, 484, 485, and 486. In an embodiment, the switch controller 470 may short-circuit the switches 481, 482, 483, 484, 485, and 486 such that the second transducer electrode 430 is separated from the substrate 410. For example, the switch controller 470 may short-circuit the second switch 482. When the second switch 482 is short-circuited, the first line 431 included in the second transducer electrode 430 may be separated from the substrate 410. The description of the first line 431 among the lines 431, 432, and 433 included in the second transducer electrode 430 may be applied to the second line 432 and the third line 433.

In an embodiment, the switch controller 470 may open the switches 481, 482, 483, 484, 485, and 486 such that the second transducer electrode 430 makes contact with the substrate 410. For example, the switch controller 470 may open the second switch 482. When the second switch 482 is opened, the first line 431 included in the second transducer electrode 430 may make contact with the substrate 410. The description of the first line 431 among the lines 431, 432, and 433 included in the second transducer electrode 430 may be applied to the second line 432 and the third line 433.

In the case of the electronic device according to the comparative example, the first transducer electrode and the second transducer electrode may be fixed on the first substrate. Accordingly, the transducer electrodes having different gaps and thicknesses for respective frequency bands have to be included in the electronic device, and therefore the electronic device may lack a mounting space. However, the electronic device 100 according to the other embodiment of the disclosure may move at least part of the second transducer electrode 430 through the switch control. When the at least part of the second transducer electrode 430 moves, the gap between the first transducer electrode 420 and the second transducer electrode 430 may vary, and therefore a frequency band that the filter 400 is able to pass may also vary. That is, according to an embodiment of the disclosure, the one filter 400 may pass signals of several frequency bands, and thus the mounting space of the electronic device 100 may be increased.

Figure 6:
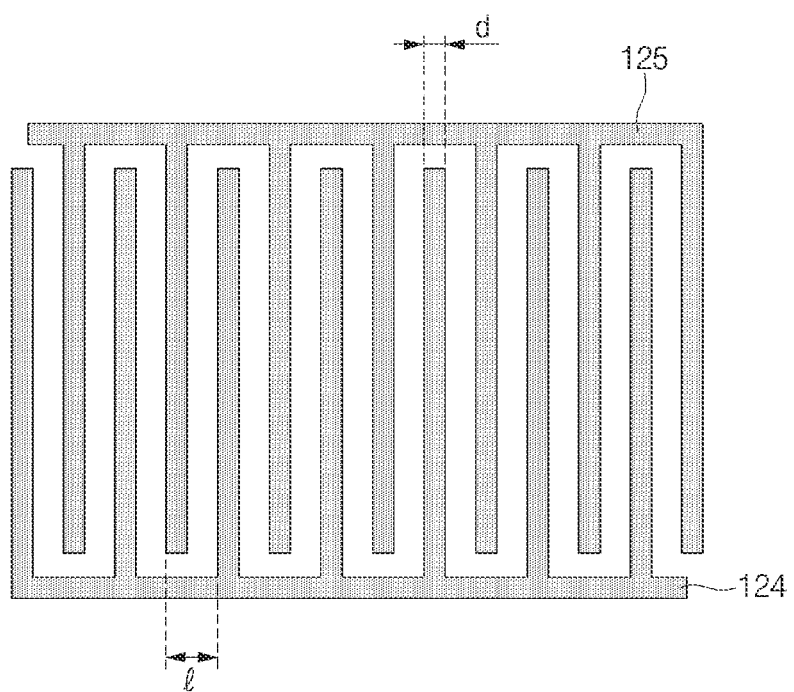
FIG. 6 is a diagram illustrating an example of a first transducer electrode and a second transducer electrode according to various embodiments.

FIG. 6 is a diagram illustrating a first transducer electrode and a second transducer electrode according to various embodiments. FIG. 6 is a view for describing the resonant frequency of a filter in greater detail.

Referring to FIG. 6, the resonant frequency of the filter 120 may be changed depending on the gap 1 between the first transducer electrode 124 and the second transducer electrode 125 and the thickness d of the first transducer electrode 124 or the second transducer electrode 125. For example, the resonant frequency may be raised as the gap 1 between the first transducer electrode 124 and the second transducer electrode 125 is decreased. The resonant frequency may be lowered as the gap 1 between the first transducer electrode 124 and the second transducer electrode 125 is increased. In the case of the disclosure, at least part of the second transducer electrode 125 may be moved, and the gap 1 between the transducer electrodes may vary accordingly. That is, when high frequency resonance is required, the second transducer electrode 125 may not be moved, and the gap 1 between the transducer electrodes may be decreased accordingly. When low frequency resonance is required, the second transducer electrode 125 may be moved, and the gap 1 between the transducer electrodes may be increased accordingly.

According to an embodiment, the resonant frequency of the filter 120 may be raised as the thickness d of the transducer electrodes is increased. The resonant frequency of the filter 120 may be lowered as the thickness d of the transducer electrodes is decreased.

Figure 7:
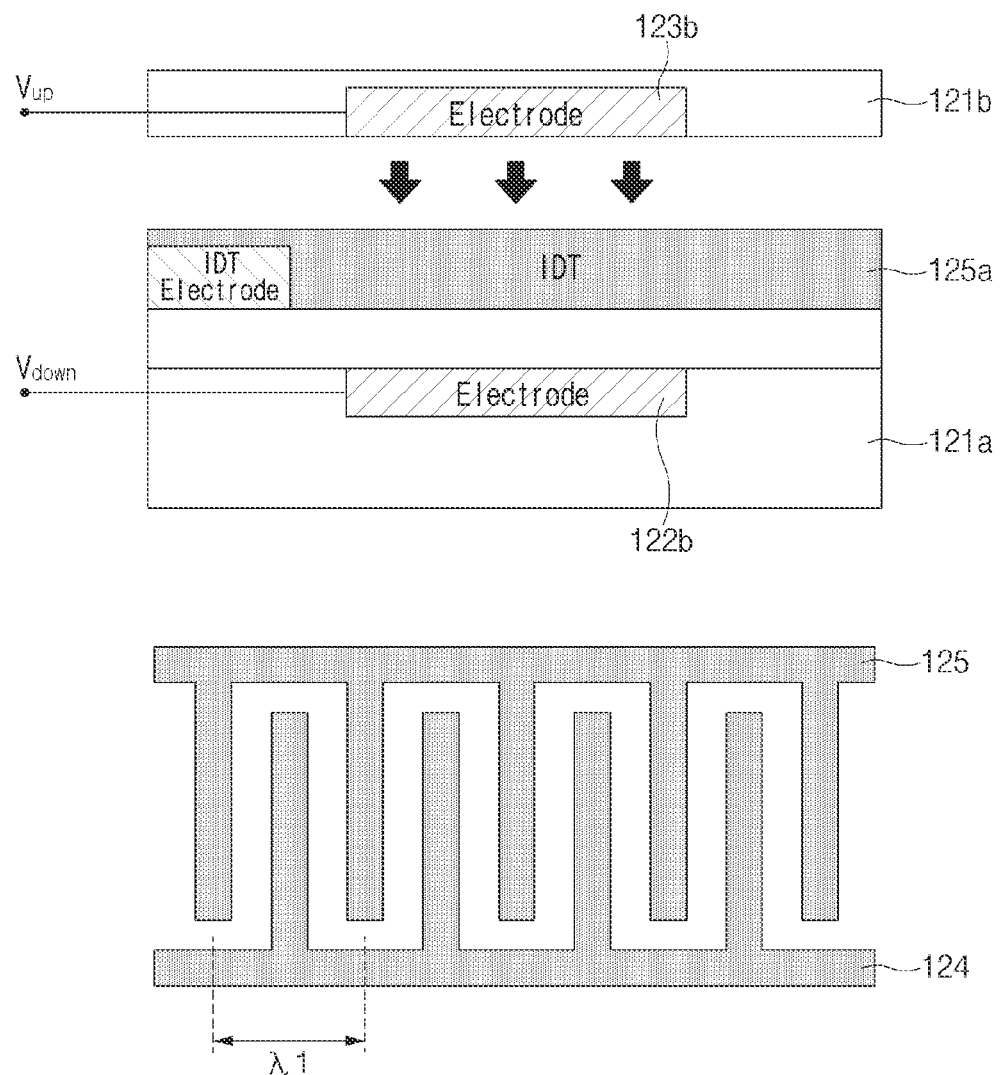
FIG. 7 is a diagram illustrating a section of a filter and surfaces of transducer electrodes according to various embodiments.

FIG. 7 is a diagram illustrating a section of a filter and surfaces of transducer electrodes according to various embodiments. FIG. 7 is a diagram illustrating an example resonant frequency in a state in which the second transducer electrode 125 is not moved.

Referring to FIG. 7, the filter 120 may apply voltages to a first group of electrodes 122 and a second group of electrodes 123 such that the voltage difference between the first group of electrodes 122 and the second group of electrodes 123 is less than a specified value. When the voltage difference between the first group of electrodes 122 and the second group of electrodes 123 is less than the specified value, the second transducer electrode 125 may be located on a first substrate 121a without moving to a second substrate 121b.

When the second transducer electrode 125 is located on the first substrate 121a, the gap $\lambda 1$ between the first transducer electrode 124 and the second transducer electrode 125 may be narrow. When the gap $\lambda 1$ between the first transducer electrode 124 and the second transducer electrode 125 is narrow, the resonant frequency of the filter 120 may be raised.

Figure 8:
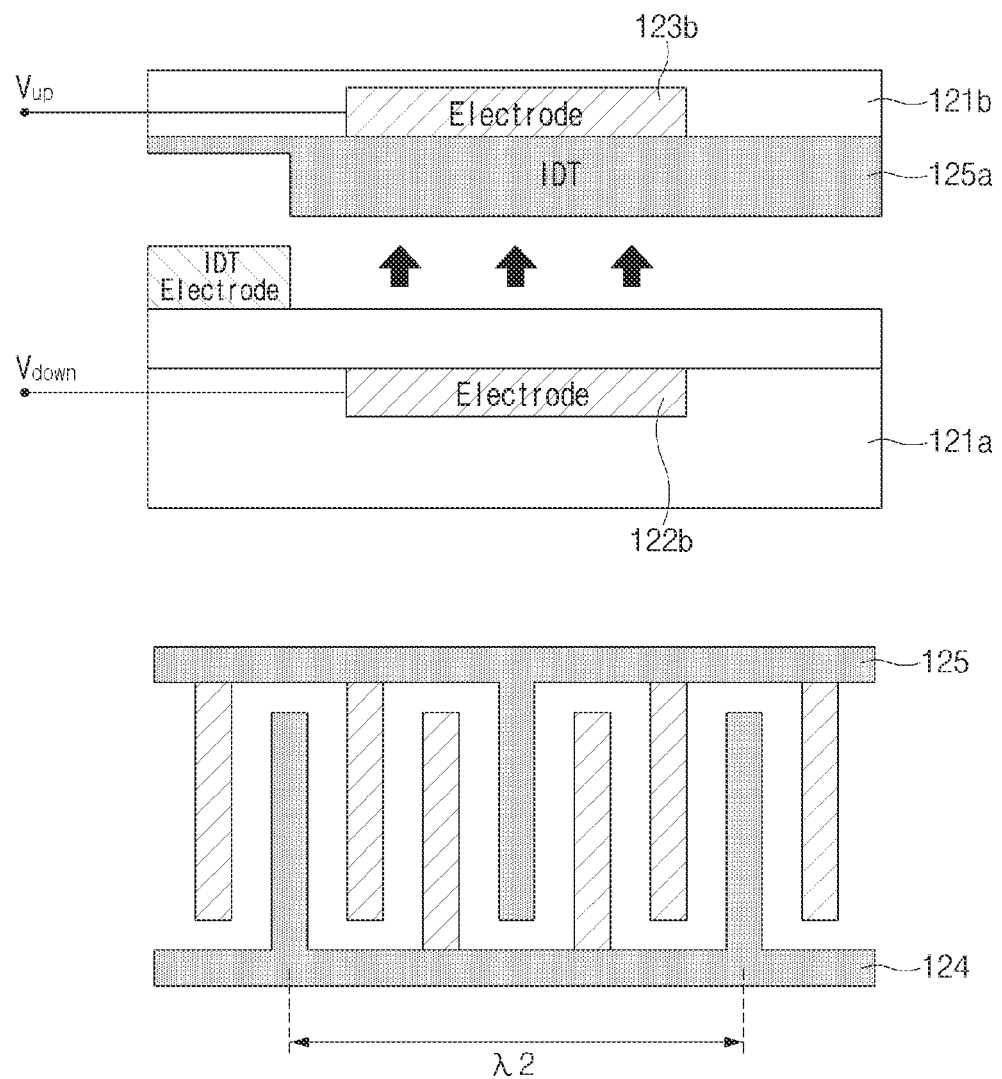
FIG. 8 is a diagram illustrating a section of a filter and surfaces of transducer electrodes according to various embodiments.

FIG. 8 is a diagram illustrating a section of a filter and surfaces of transducer electrodes according to an embodiment. FIG. 8 is a diagram illustrating a resonant frequency in a state in which the second transducer electrode 125 is moved.

Referring to FIG. 8, the filter 120 may apply voltages to a first group of electrodes 122 and a second group of electrodes 123 such that the voltage difference between the first group of electrodes 122 and the second group of electrodes 123 is greater than or equal to a specified value. When the voltage difference between the first group of electrodes 122 and the second group of electrodes 123 is greater than or equal to the specified value, at least part of the second transducer electrode 125 may be moved to a second substrate 121b, and the remaining part of the first transducer electrode 124 and the second transducer electrode 125 may be located on a first substrate 121a.

When the remaining part of the first transducer electrode 124 and the second transducer electrode 125 is located on the first substrate 121a, the gap $\lambda 2$ between the first transducer electrode 124 and the second transducer electrode 125 may be wide. When the gap $\lambda 2$ between the first transducer electrode 124 and the second transducer electrode 125 is wide, the resonant frequency of the filter 120 may be lowered.

In the disclosure, the contents described with reference to FIGS. 7 and 8 may be identically or similarly applied to the filter 400 illustrated in FIGS. 4 and 5.

Figure 9:
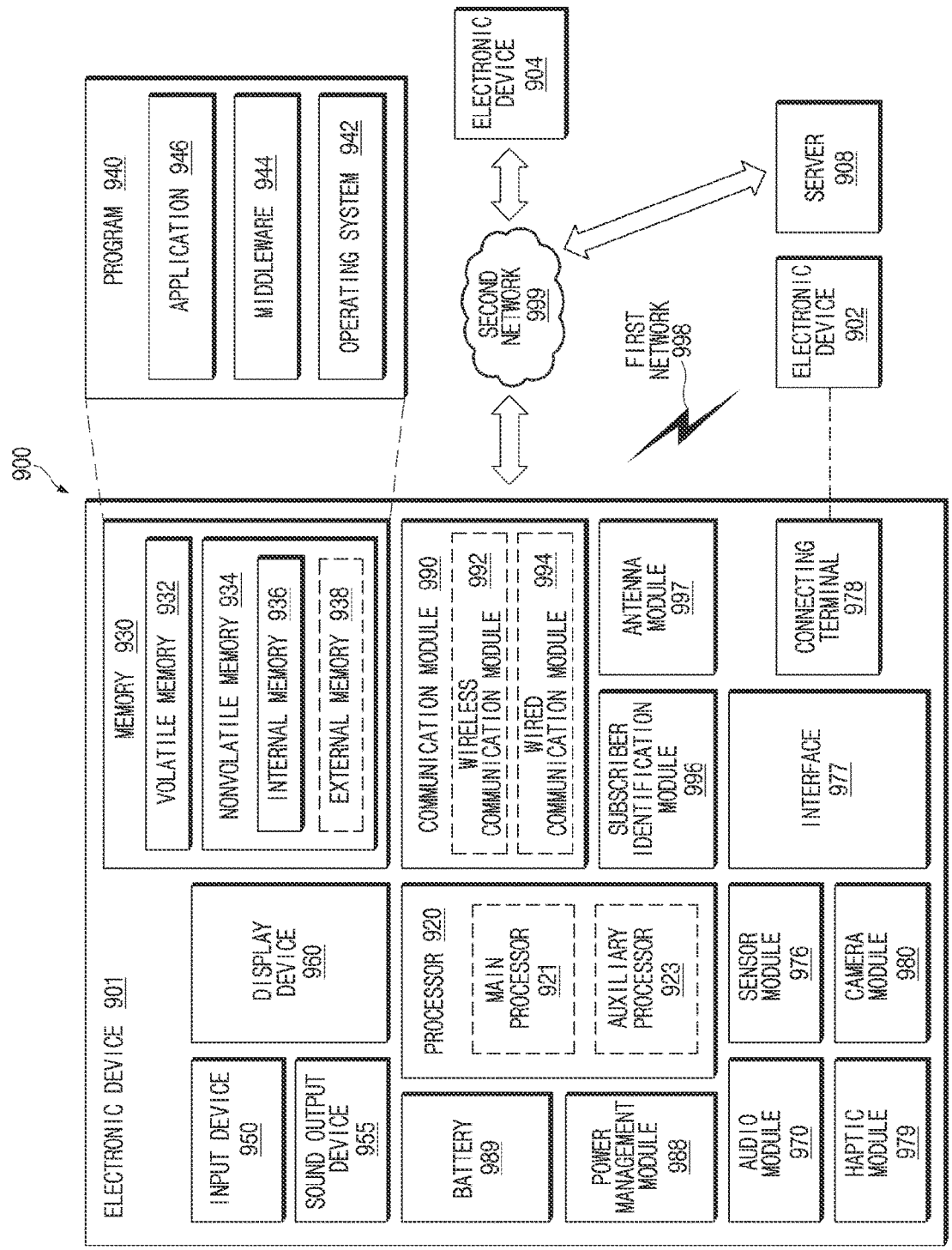
FIG. 9 is a block diagram illustrating an example electronic device in a network environment according to various embodiments.

FIG. 9 is a block diagram illustrating an example electronic device 901 in a network environment 900 according to various embodiments.

Referring to FIG. 9, the electronic device 901 in the network environment 900 may communicate with an electronic device 902 via a first network 998 (e.g., a short-range wireless communication network), or an electronic device 904 or a server 908 via a second network 999 (e.g., a long-range wireless communication network). According to an embodiment, the electronic device 901 may communicate with the electronic device 904 via the server 908. According to an embodiment, the electronic device 901 may include a processor 920, memory 930, an input device 950, a sound output device 955, a display device 960, an audio module 970, a sensor module 976, an interface 977, a haptic module 979, a camera module 980, a power management module 988, a battery 989, a communication module 990, a subscriber identification module (SIM) 996, or an antenna module 997. In various embodiments, at least one (e.g., the display device 960 or the camera module 980) of the components may be omitted from the electronic device 901, or one or more other components may be added in the electronic device 901. In various embodiments, some of the components may be implemented as single integrated circuitry. For example, the sensor module 976 (e.g., a fingerprint sensor, an iris sensor, or an illuminance sensor) may be implemented as embedded in the display device 960 (e.g., a display).

The processor 920 may execute, for example, software (e.g., a program 940) to control at least one other component (e.g., a hardware or software component) of the electronic device 901 coupled with the processor 920, and may perform various data processing or computation. According to an embodiment, as at least part of the data processing or computation, the processor 920 may load a command or data received from another component (e.g., the sensor module 976 or the communication module 990) in volatile memory 932, process the command or the data stored in the volatile memory 932, and store resulting data in non-volatile memory 934. According to an embodiment, the processor 920 may include a main processor 921 (e.g., a central processing unit (CPU) or an application processor (AP)), and an auxiliary processor 923 (e.g., a graphics processing unit (GPU), an image signal processor (ISP), a sensor hub processor, or a communication processor (CP)) that is operable independently from, or in conjunction with, the main processor 921. Additionally or alternatively, the auxiliary processor 923 may be adapted to consume less power than the main processor 921, or to be specific to a specified function. The auxiliary processor 923 may be implemented as separate from, or as part of the main processor 921.

The auxiliary processor 923 may control at least some of functions or states related to at least one component (e.g., the display device 960, the sensor module 976, or the communication module 990) among the components of the electronic device 901, instead of the main processor 921 while the main processor 921 is in an inactive (e.g., sleep) state, or together with the main processor 921 while the main processor 921 is in an active state (e.g., executing an application). According to an embodiment, the auxiliary processor 923 (e.g., an image signal processor or a communication processor) may be implemented as part of another component (e.g., the camera module 980 or the communication module 990) functionally related to the auxiliary processor 923.

The memory 930 may store various data used by at least one component (e.g., the processor 920 or the sensor module 976) of the electronic device 901. The various data may include, for example, software (e.g., the program 940) and input data or output data for a command related thereto. The memory 930 may include the volatile memory 932 or the non-volatile memory 934.

The program 940 may be stored in the memory 930 as software, and may include, for example, an operating system (OS) 942, middleware 944, or an application 946.

The input device 950 may receive a command or data to be used by other component (e.g., the processor 920) of the electronic device 901, from the outside (e.g., a user) of the electronic device 901. The input device 950 may include, for example, a microphone, a mouse, a keyboard, or a digital pen (e.g., a stylus pen).

The sound output device 955 may output sound signals to the outside of the electronic device 901. The sound output device 955 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 960 may visually provide information to the outside (e.g., a user) of the electronic device 901. The display device 960 may include, for example, a display, a hologram device, or a projector and control circuitry to control a corresponding one of the display, hologram device, and projector. According to an embodiment, the display device 960 may include touch circuitry adapted to detect a touch, or sensor circuitry (e.g., a pressure sensor) adapted to measure the intensity of force incurred by the touch.

The audio module 970 may convert a sound into an electrical signal and vice versa. According to an embodiment, the audio module 970 may obtain the sound via the input device 950, or output the sound via the sound output device 955 or a headphone of an external electronic device (e.g., an electronic device 902) directly (e.g., wiredly) or wirelessly coupled with the electronic device 901.

The sensor module 976 may detect an operational state (e.g., power or temperature) of the electronic device 901 or an environmental state (e.g., a state of a user) external to the electronic device 901, and then generate an electrical signal or data value corresponding to the detected state. According to an embodiment, the sensor module 976 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 977 may support one or more specified protocols to be used for the electronic device 901 to be coupled with the external electronic device (e.g., the electronic device 902) directly (e.g., wiredly) or wirelessly. According to an embodiment, the interface 977 may include, for example, a high definition multimedia interface (HDMI), a universal serial bus (USB) interface, a secure digital (SD) card interface, or an audio interface.

A connecting terminal 978 may include a connector via which the electronic device 901 may be physically connected with the external electronic device (e.g., the electronic device 902). According to an embodiment, the connecting terminal 978 may include, for example, a HDMI connector, a USB connector, a SD card connector, or an audio connector (e.g., a headphone connector).

The haptic module 979 may convert an electrical signal into a mechanical stimulus (e.g., a vibration or a movement) or electrical stimulus which may be recognized by a user via his tactile sensation or kinesthetic sensation. According to an embodiment, the haptic module 979 may include, for example, a motor, a piezoelectric element, or an electric stimulator.

The camera module 980 may capture a still image or moving images. According to an embodiment, the camera module 980 may include one or more lenses, image sensors, image signal processors, or flashes.

The power management module 988 may manage power supplied to the electronic device 901. According to an embodiment, the power management module 988 may be implemented as at least part of, for example, a power management integrated circuit (PMIC).

The battery 989 may supply power to at least one component of the electronic device 901. According to an embodiment, the battery 989 may include, for example, a primary cell which is not rechargeable, a secondary cell which is rechargeable, or a fuel cell.

The communication module 990 may support establishing a direct (e.g., wired) communication channel or a wireless communication channel between the electronic device 901 and the external electronic device (e.g., the electronic device 902, the electronic device 904, or the server 908) and performing communication via the established communication channel. The communication module 990 may include one or more communication processors that are operable independently from the processor 920 (e.g., the application processor (AP)) and supports a direct (e.g., wired) communication or a wireless communication. According to an embodiment, the communication module 990 may include a wireless communication module 992 (e.g., a cellular communication module, a short-range wireless communication module, or a global navigation satellite system (GNSS) communication module) or a wired communication module 994 (e.g., a local area network (LAN) communication module or a power line communication (PLC) module). A corresponding one of these communication modules may communicate with the external electronic device via the first network 998 (e.g., a short-range communication network, such as Bluetooth™, wireless-fidelity (Wi-Fi) direct, or infrared data association (IrDA)) or the second network 999 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 992 may identify and authenticate the electronic device 901 in a communication network, such as the first network 998 or the second network 999, using subscriber information (e.g., international mobile subscriber identity (IMSI)) stored in the subscriber identification module 996.

The antenna module 997 may transmit or receive a signal or power to or from the outside (e.g., the external electronic device) of the electronic device 901. According to an embodiment, the antenna module 997 may include an antenna including a radiating element including a conductive material or a conductive pattern formed in or on a substrate (e.g., PCB). According to an embodiment, the antenna module 997 may include a plurality of antennas. In such a case, at least one antenna appropriate for a communication scheme used in the communication network, such as the first network 998 or the second network 999, may be selected, for example, by the communication module 990 (e.g., the wireless communication module 992) from the plurality of antennas. The signal or the power may then be transmitted or received between the communication module 990 and the external electronic device via the selected at least one antenna. According to an embodiment, another component (e.g., a radio frequency integrated circuit (RFIC)) other than the radiating element may be additionally formed as part of the antenna module 997.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 901 and the external electronic device 904 via the server 908 coupled with the second network 999. Each of the electronic devices 902 and 904 may be a device of a same type as, or a different type, from the electronic device 901. According to an embodiment, all or some of operations to be executed at the electronic device 901 may be executed at one or more of the external electronic devices 902, 904, or 908. For example, if the electronic device 901 should perform a function or a service automatically, or in response to a request from a user or another device, the electronic device 901, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 901. The electronic device 901 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 940) including one or more instructions that are stored in a storage medium (e.g., internal memory 936 or external memory 938) that is readable by a machine (e.g., the electronic device 901). For example, a processor (e.g., the processor 920) of the machine (e.g., the electronic device 901) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
   at least one antenna;
   a filter connected with the at least one antenna and configured to pass a signal of a specific frequency band among signals transmitted and received through the at least one antenna; and
   a processor connected with the filter and configured to control the filter to pass the signal of the specific frequency band,
   wherein the filter includes:
   a first substrate;
   a second substrate facing the first substrate;
   a first group of electrodes disposed inside the first substrate;
   a second group of electrodes disposed inside the second substrate;
   a first transducer electrode including a first group of lines extending in a first direction on the first substrate;
   a second transducer electrode including a second group of lines extending in a second direction opposite to the first direction on the first substrate and disposed to alternate with the first group of lines; and
   a power supply configured to apply voltages to the first group of electrodes and the second group of electrodes,
   wherein the processor is configured to cause at least one of the second group of lines to be separated from the first substrate, by controlling the power supply to apply the voltages to the first group of electrodes and the second group of electrodes based on a frequency of a signal to be passed through the filter.

2. The electronic device of claim 1, wherein the second group of lines are configured to be separated from the first substrate based on the power supply applying the voltages to the first group of electrodes and the second group of electrodes such that a voltage difference between the first group of electrodes and the second group of electrodes is greater than or equal to a specified value.

3. The electronic device of claim 2, wherein the second group of lines is configured to make contact with the first substrate based on the power supply applying the voltages to the first group of electrodes and the second group of electrodes such that the voltage difference between the first group of electrodes and the second group of electrodes is less than the specified value.

4. The electronic device of claim 1, wherein the processor is configured to decrease the frequency of the signal to be passed through the filter, by increasing a number of lines separated from the first substrate among the second group of lines.

5. The electronic device of claim 1, wherein the processor is configured to increase the frequency of the signal to be passed through the filter, by decreasing a number of lines separated from the first substrate among the second group of lines.

6. The electronic device of claim 1, wherein the first transducer electrode and the second transducer electrode correspond to an inter-digital transducer (IDT).

7. The electronic device of claim 1, wherein the first group of electrodes are disposed inside the first substrate to correspond to the first transducer electrode and the second transducer electrode.

8. The electronic device of claim 1, wherein the second group of electrodes are disposed inside the second substrate to correspond to the first transducer electrode and the second transducer electrode.

9. The electronic device of claim 1, wherein at least part of the first substrate comprises a piezoelectric material.

10. An electronic device comprising:
    at least one antenna;
    a filter connected with the at least one antenna and configured to pass a signal of a specific frequency band among signals transmitted and received through the at least one antenna; and
    a processor connected with the filter and configured to control the filter to pass the signal of the specific frequency band,
    wherein the filter includes:
    a substrate;
    an electrode plate facing the substrate;
    a power supply configured to apply a voltage to the electrode plate;
    first transducer electrodes disposed on the substrate;
    second transducer electrodes disposed on the substrate to alternate with the first transducer electrodes;
    a plurality of switches connected with the first transducer electrodes and the second transducer electrodes; and
    a switch controller configured to control short-circuiting or opening of the switches,
    wherein the processor is configured to cause at least one of the second transducer electrodes to be separated from the substrate, by controlling the switch controller to short-circuit or open the switches based on a frequency of a signal to be passed through the filter.

11. The electronic device of claim 10, wherein each of the first transducer electrodes and the second transducer electrodes includes:

an electrode layer separated from the substrate based on whether the switches are short-circuited or opened;

an inter-digital transducer (IDT) disposed on the substrate; and a spring disposed between the electrode layer and the IDT.

12. The electronic device of claim 10, wherein based on at least some of the switches being short-circuited, some of the second transducer electrodes corresponding to the short-circuited switches are separated from the substrate.

13. The electronic device of claim 10, wherein based on at least some of the switches being opened, some of the second transducer electrodes corresponding to the open switches make contact with the substrate.

14. The electronic device of claim 10, wherein the processor is configured to decrease the frequency of the signal to be passed through the filter, by increasing the number of lines of the second transducer electrodes separated from the substrate.

15. The electronic device of claim 10, wherein the processor is configured to increase the frequency of the signal to be passed through the filter, by decreasing the number of lines of the second transducer electrodes separated from the substrate.

* * * * *